United States Patent
Kai et al.

(10) Patent No.: US 9,524,779 B2
(45) Date of Patent: Dec. 20, 2016

(54) THREE DIMENSIONAL VERTICAL NAND DEVICE WITH FLOATING GATES

(71) Applicant: SanDisk Technologies, Inc., Plano, TX (US)

(72) Inventors: James Kai, Santa Clara, CA (US); Henry Chien, San Jose, CA (US); George Matamis, Danville, CA (US); Thomas Jongwan Kwon, Dublin, CA (US); Yao-Sheng Lee, Tampa, FL (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 78 days.

(21) Appl. No.: 14/313,508

(22) Filed: Jun. 24, 2014

(65) Prior Publication Data

US 2015/0371709 A1 Dec. 24, 2015

(51) Int. Cl.
*G11C 16/04* (2006.01)
*H01L 27/115* (2006.01)
(Continued)

(52) U.S. Cl.
CPC ..... *G11C 16/0425* (2013.01); *H01L 21/02164* (2013.01); *H01L 21/28273* (2013.01);
(Continued)

(58) Field of Classification Search
CPC .................. H01L 27/11531; H01L 27/11524; H01L 27/11551; H01L 27/11553; H01L 27/11556; G11C 16/0408; G11C 16/0425; G11C 16/0433
See application file for complete search history.

(56) References Cited

U.S. PATENT DOCUMENTS 5,897,354 A 4/1999 Kachelmeier
5,915,167 A 6/1999 Leedy
(Continued)

FOREIGN PATENT DOCUMENTS

WO WO02/15277 A2 2/2002

OTHER PUBLICATIONS

International Search Authority for International Application No. PCT/US2015/035321, Invitation to Pay Additional Fees and Where Applicable, Protest Fee, mailed Sep. 18, 2015, (7 pages).
(Continued)

*Primary Examiner* — Allison P Bernstein
(74) *Attorney, Agent, or Firm* — The Marbury Law Group PLLC

(57) ABSTRACT

A monolithic three dimensional NAND string including a stack of alternating first material layers and second material layers different from the first material layers over a major surface of a substrate. The first material layers include a plurality of control gate electrodes and the second material layers include an insulating material and the plurality of control gate electrodes extend in a first direction. The NAND string also includes a semiconductor channel, a blocking dielectric, and a plurality of vertically spaced apart floating gates. Each of the plurality of vertically spaced apart floating gates or each of the second material layers includes a first portion having a first thickness in the second direction, and a second portion adjacent to the first portion in the first direction and having a second thickness in the second direction which is different than the first thickness.

20 Claims, 13 Drawing Sheets

(51) Int. Cl.

| | | |
|---|---|---|
| *H01L 29/788* | (2006.01) | |
| *H01L 29/423* | (2006.01) | |
| *H01L 29/49* | (2006.01) | |
| *H01L 21/306* | (2006.01) | |
| *H01L 21/28* | (2006.01) | |
| *H01L 21/311* | (2006.01) | |
| *H01L 21/3213* | (2006.01) | |
| *H01L 21/02* | (2006.01) | |
| *H01L 21/285* | (2006.01) | |
| *H01L 29/66* | (2006.01) | |

(52) U.S. Cl.
CPC .. *H01L 21/28562* (2013.01); *H01L 21/30604* (2013.01); *H01L 21/31111* (2013.01); *H01L 21/32133* (2013.01); *H01L 27/11519* (2013.01); *H01L 27/11524* (2013.01); *H01L 27/11556* (2013.01); *H01L 29/42324* (2013.01); *H01L 29/42328* (2013.01); *H01L 29/4916* (2013.01); *H01L 29/4975* (2013.01); *H01L 29/66825* (2013.01); *H01L 29/7883* (2013.01)

(56) References Cited

U.S. PATENT DOCUMENTS

| | | |
|---|---|---|
| 6,238,978 B1 | 5/2001 | Huster |
| 6,888,755 B2 | 5/2005 | Harari |
| 6,953,697 B1 | 10/2005 | Castle et al. |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,237,213 B2 | 8/2012 | Liu |
| 8,349,681 B2 | 1/2013 | Alsmeier et al. |
| 8,461,000 B2 | 6/2013 | Alsmeier et al. |
| 8,580,639 B2 | 11/2013 | Alsmeier et al. |
| 2005/0157549 A1* | 7/2005 | Mokhlesi ............ H01L 27/115 365/185.01 |
| 2007/0210338 A1 | 9/2007 | Orlowski |
| 2007/0252201 A1 | 11/2007 | Kito et al. |
| 2008/0173928 A1 | 7/2008 | Arai et al. |
| 2009/0283819 A1 | 11/2009 | Ishikawa et al. |
| 2009/0294828 A1 | 12/2009 | Ozawa et al. |
| 2010/0044778 A1 | 2/2010 | Seol et al. |
| 2010/0120214 A1 | 5/2010 | Park et al. |
| 2010/0155810 A1 | 6/2010 | Kim et al. |
| 2010/0155818 A1 | 6/2010 | Cho et al. |
| 2010/0213527 A1 | 8/2010 | Shim et al. |
| 2010/0240205 A1 | 9/2010 | Son et al. |
| 2012/0012921 A1 | 1/2012 | Liu |
| 2012/0092926 A1 | 4/2012 | Whang et al. |
| 2012/0132981 A1 | 5/2012 | Imamura et al. |
| 2013/0200450 A1 | 8/2013 | Kusai et al. |
| 2014/0045307 A1 | 2/2014 | Alsmeier et al. |
| 2014/0264532 A1 | 9/2014 | Dennison et al. |

OTHER PUBLICATIONS

Endoh et al., "Novel Ultra High Density Memory with a Stacked-Surrounding Gate Transistor (S-SGT) Structured Cell," IEDM Proc., (2001), 33-36.

Katsumata et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-shaped BiCS Flash Memory," 2009 Symposium on VLSI Technology Digest of Technical Papers, pp. 22-23.

U.S. Appl. No. 14/183,152, filed Feb. 18, 2014, SanDisk Technologies Inc.

U.S. Appl. No. 14/265,733, filed Apr. 30, 2014, SanDisk Technologies Inc.

International Search Report and Written Opinion issued for International Application No. PCT/US2015/035321,mailed Dec. 18, 2015, (19 pages).

* cited by examiner

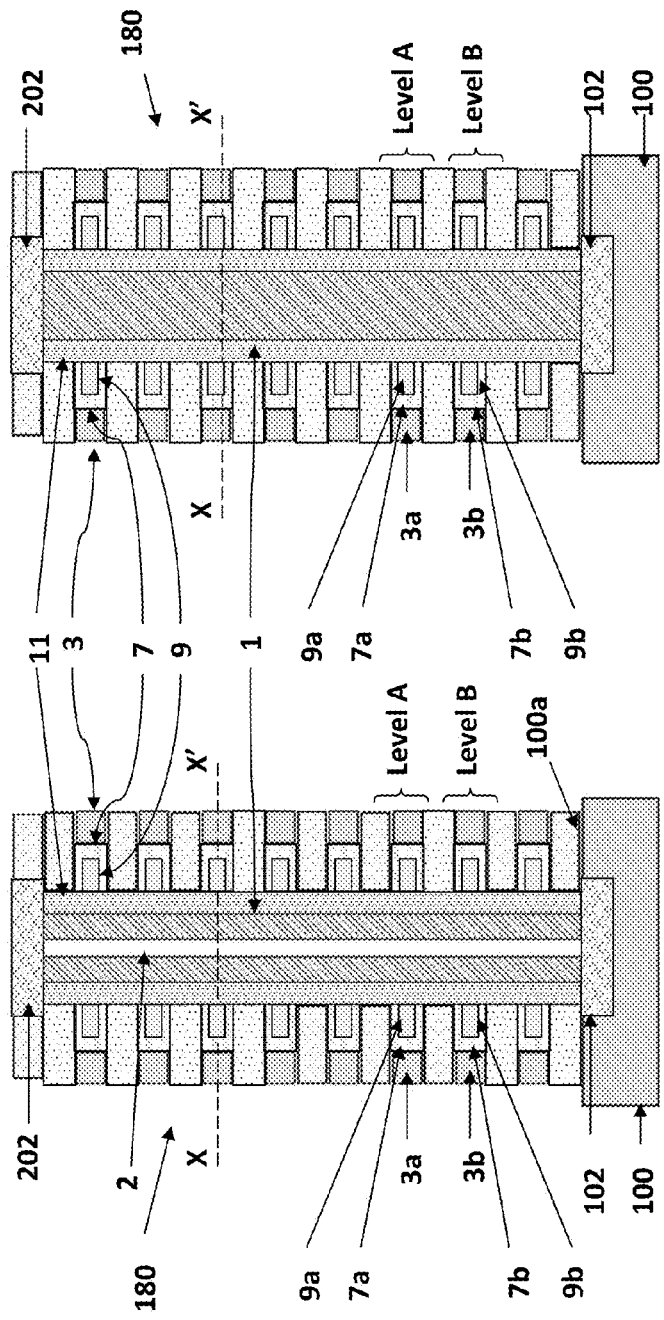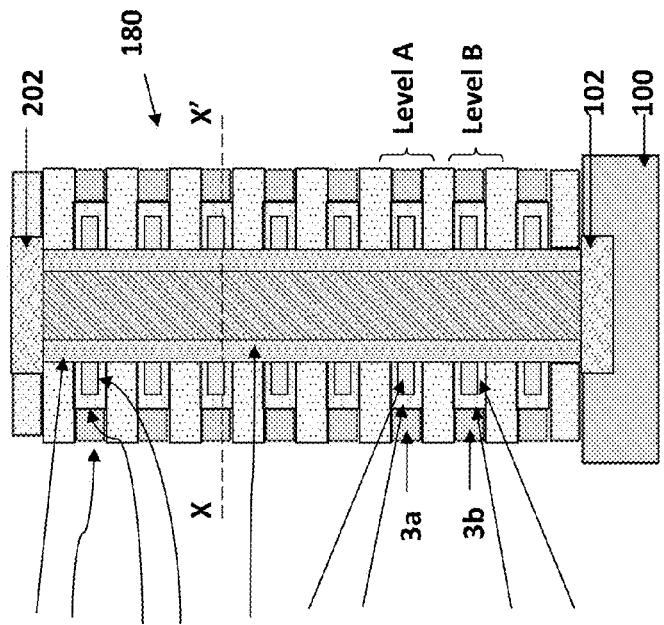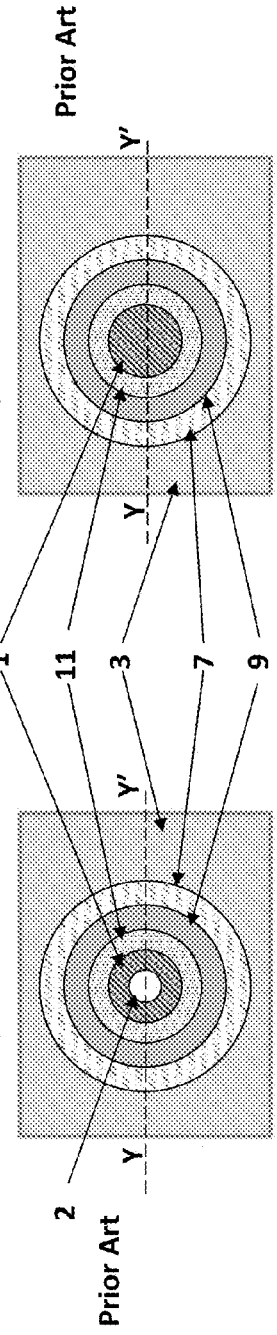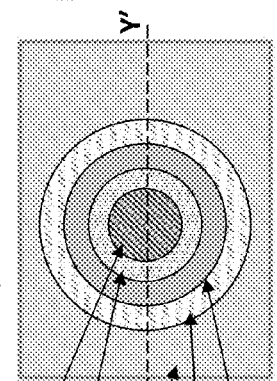

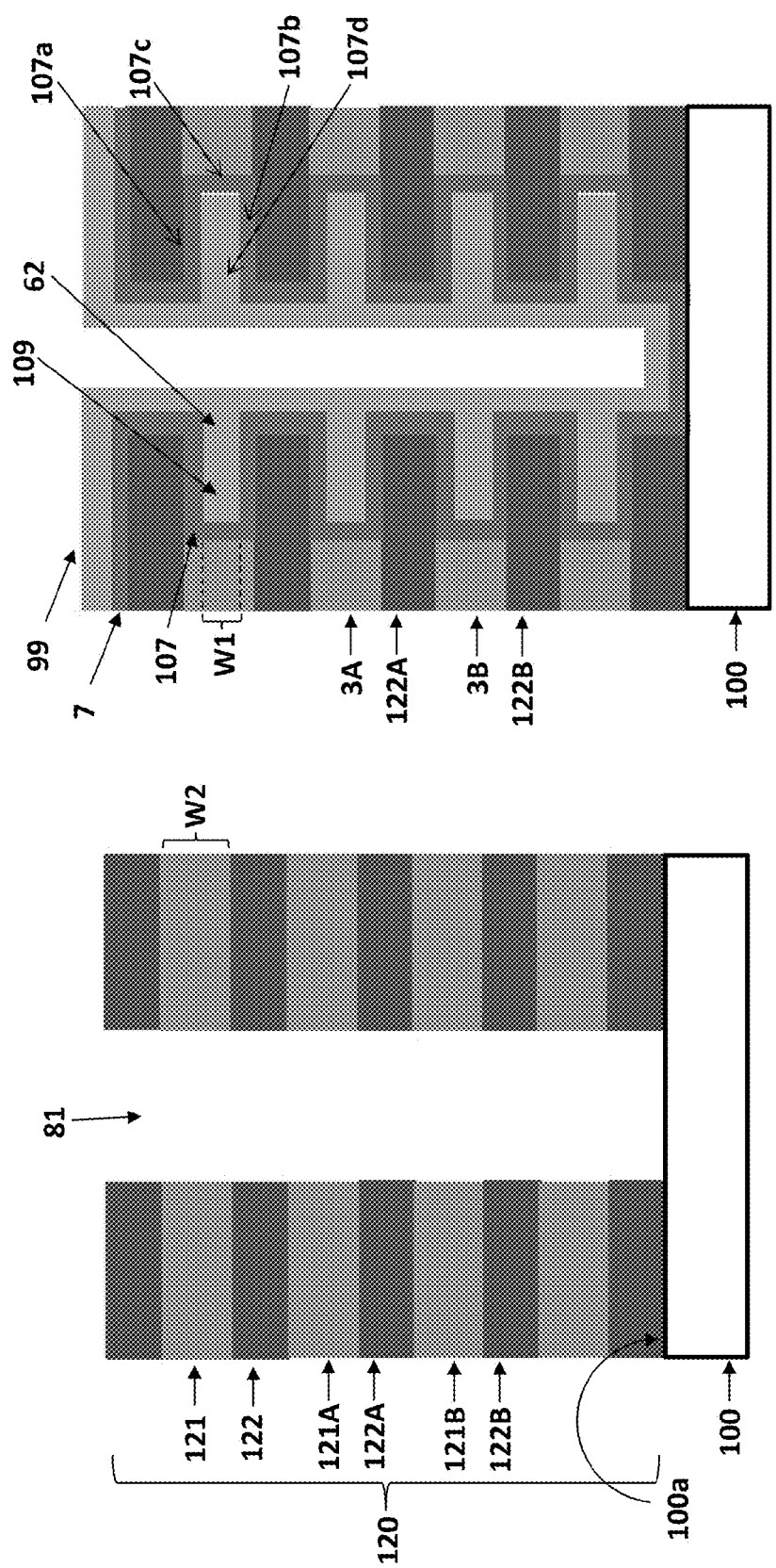

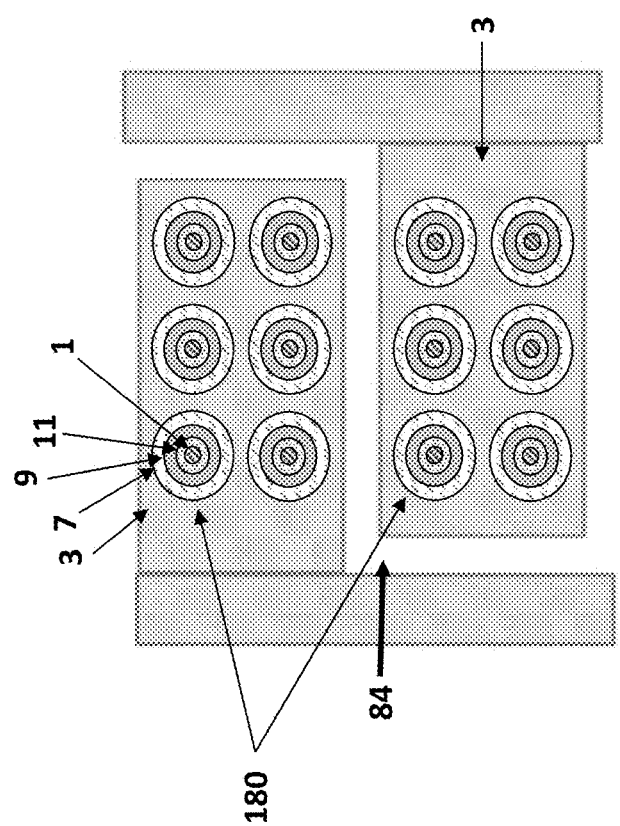

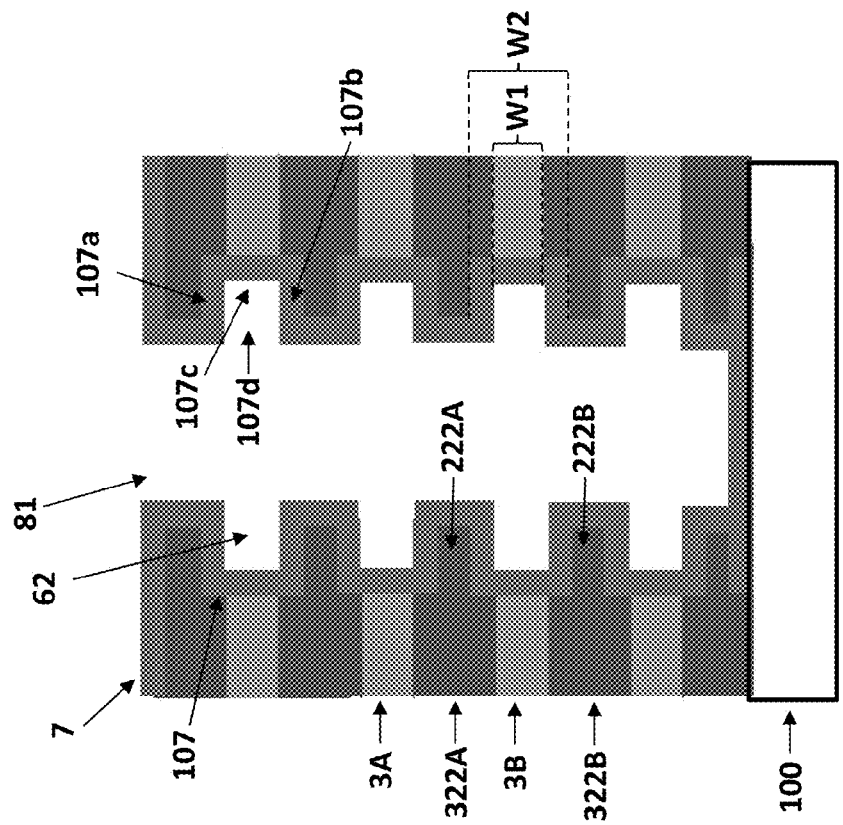
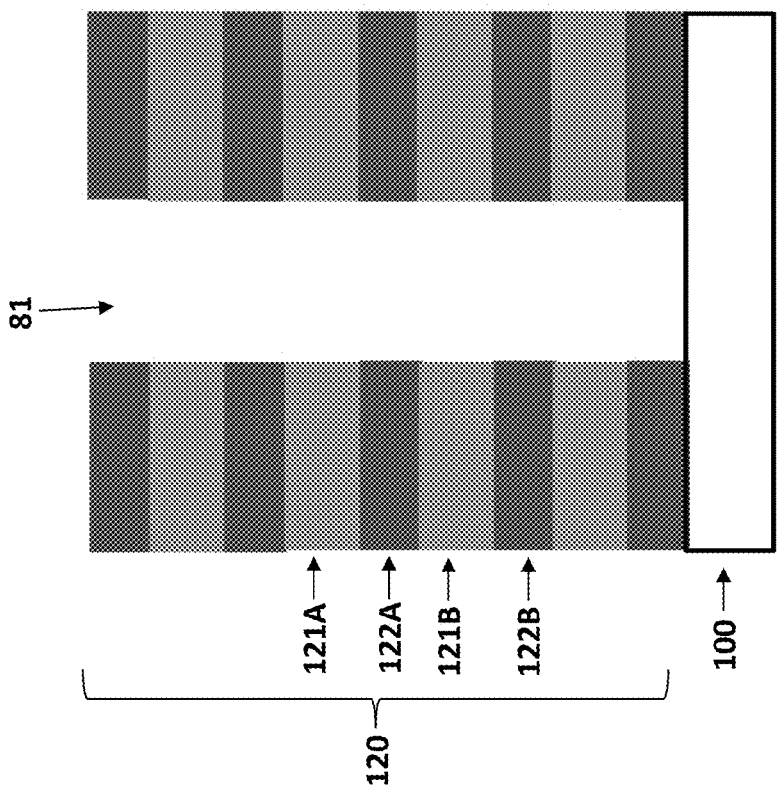
Fig. 5B
Fig. 5A

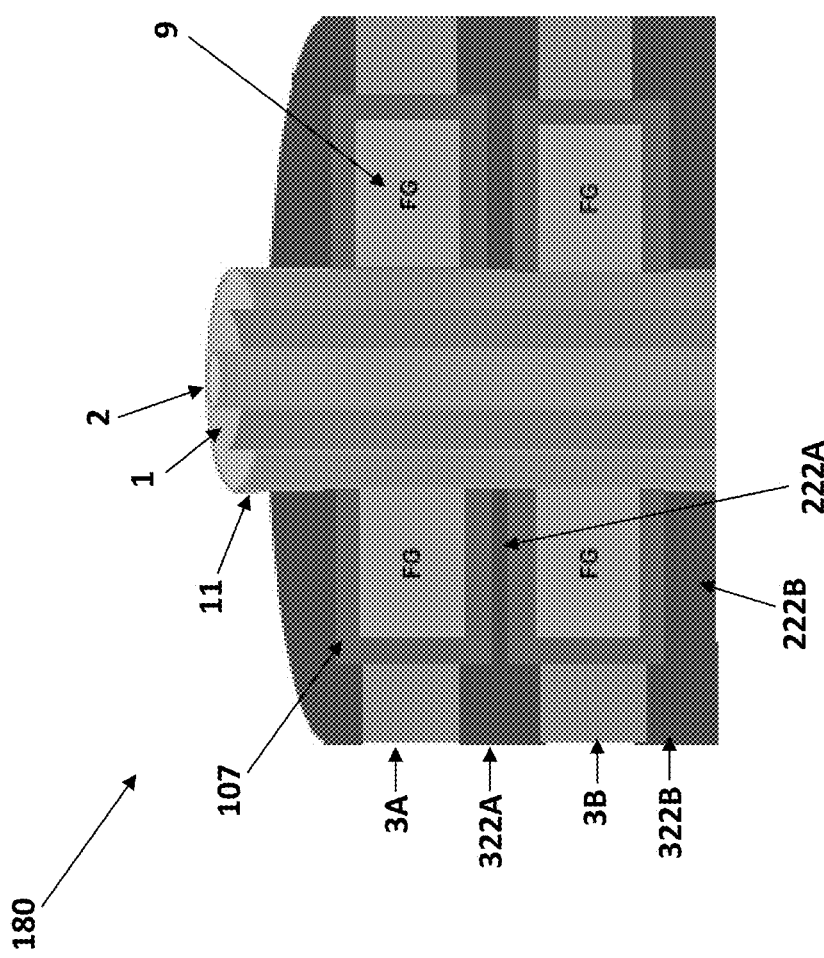

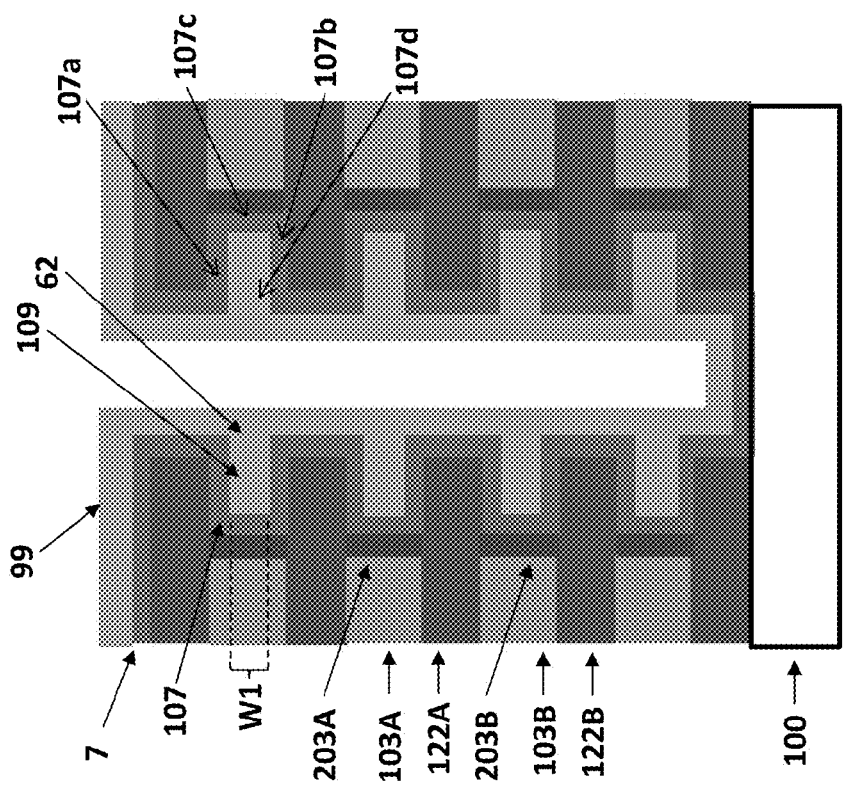
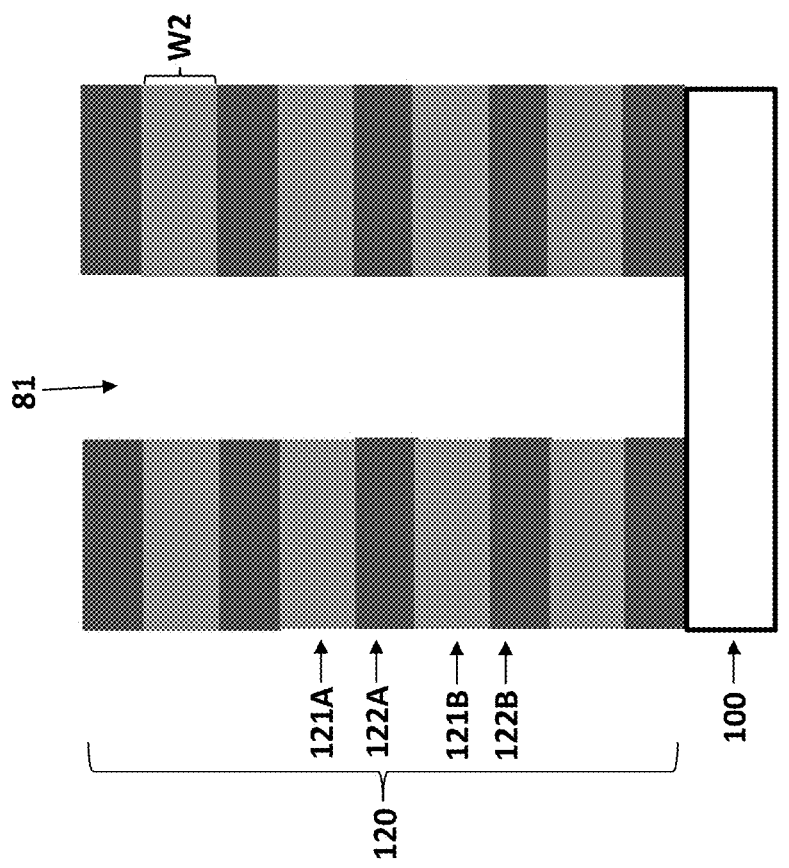

THREE DIMENSIONAL VERTICAL NAND DEVICE WITH FLOATING GATES

FIELD

The present invention relates generally to the field of semiconductor devices and specifically to three dimensional vertical NAND strings and other three dimensional devices and methods of making thereof.

BACKGROUND

Three dimensional vertical NAND strings are disclosed in an article by T. Endoh, et. al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

SUMMARY

An embodiment relates to a monolithic three dimensional NAND string including a stack of alternating first material layers and second material layers different from the first material layers over a major surface of a substrate. The first material layers include a plurality of control gate electrodes and the second material layers include an insulating material and the plurality of control gate electrodes extend in a first direction substantially parallel to the major surface of the substrate and include at least a first control gate electrode located in a first device level and a second control gate electrode located in a second device level located above the first device level. The NAND string also includes a semiconductor channel including at least one portion extending through the stack in a second direction substantially perpendicular to the major surface of the substrate, a blocking dielectric located in contact with the plurality of control gate electrodes, a plurality of vertically spaced apart floating gates, wherein the plurality of vertically spaced apart floating gates include at least a first spaced apart floating gate located in the first device level and a second spaced apart floating gate located in the second device level and a tunnel dielectric located between each one of the plurality of the vertically spaced apart floating gates and the semiconductor channel. Each of the plurality of vertically spaced apart floating gates or each of the second material layers includes a first portion having a first thickness in the second direction, and a second portion adjacent to the first portion in the first direction and having a second thickness in the second direction which is different than the first thickness.

Another embodiment relates to a method of making a monolithic three dimensional NAND string including providing a stack of alternating first material layers and second material layers different from the first material layer over a major surface of a substrate, etching at least one memory opening in the stack, selectively etching the first material layers to form a plurality of recesses between adjacent second material layers, conformally depositing a blocking dielectric in the plurality of recesses through the memory opening. Portions of the blocking dielectric in each of the plurality of recesses have a clam shape having a vertical portion adjacent a remaining portion of the first material layer and horizontal portions adjacent the second material layers and an opening having a first thickness in the recess, forming a floating gate material in the openings in the clam shaped portions of the blocking dielectric, partially removing the floating gate material and the blocking dielectric in the plurality of recesses to form first portions of a plurality of floating gates located in the opening in the partially removed clam shaped portions of the blocking dielectric, forming second portions of the plurality of floating gates in the recesses, forming a tunnel dielectric in the memory opening and forming a semiconductor channel over the tunnel dielectric in the memory opening.

Another embodiment relates to a method of making a monolithic three dimensional NAND string including providing a stack of alternating first material layers and second material layers different from the first material layer over a substrate, etching at least one memory opening in the stack, selectively etching the first material layers to form a plurality of recesses between adjacent second material layers, selectively etching the second material layers to widen the plurality of recesses, conformally depositing a blocking dielectric in the plurality of recesses through the memory opening. Portions of the blocking dielectric in each of the plurality of recesses have a clam shape having a vertical portion adjacent a remaining portion of the first material layer and horizontal portions adjacent the second material layers and an opening having a first thickness in the recess, forming a plurality of floating gates located in the opening in the clam shaped portions of the blocking dielectric, forming a tunnel dielectric in the memory opening and forming a semiconductor channel over the tunnel dielectric in the memory opening.

Another embodiment relates to a method of operating a monolithic three dimensional NAND string having a semiconductor channel having at least one portion extending substantially perpendicular to a major surface of a substrate, a source electrode and a drain electrode contacting opposite ends of the semiconductor channel, a tunnel dielectric, and a control gate electrode separated from a charge storage region by a blocking dielectric, the method including applying a first voltage difference between the source electrode or the drain electrode and the control gate electrode to cause a charge to flow from the control gate electrode through the blocking dielectric into the charge storage region.

BRIEF DESCRIPTION OF THE DRAWINGS

FIGS. 1A and 1B are respectively side cross sectional and top cross sectional views of a conventional NAND string. FIG. 1A is a side cross sectional view of the device along line Y-Y' in FIG. 1B, while FIG. 1B is a side cross sectional view of the device along line X-X' in FIG. 1A.

FIGS. 2A and 2B are respectively side cross sectional and top cross sectional views of another conventional NAND string. FIG. 2A is a side cross sectional view of the device along line Y-Y' in FIG. 2B, while FIG. 2B is a side cross sectional view of the device along line X-X' in FIG. 2A.

FIGS. 4A-4D are side cross sectional schematic illustrations of a method of making a NAND string according to an embodiment.

FIG. 4F is a top cross sectional schematic illustration of a step of a method of making a NAND string according to an alternative embodiment.

FIGS. 5A-5D and 5E are respective side cross sectional and hybrid perspective side cross sectional schematic illustrations of a method of making a NAND string according to another embodiment.

FIGS. 6A-6D and 6E are respective side cross sectional and hybrid perspective side cross sectional schematic illustrations of methods of making a NAND string according to alternative embodiments.

DETAILED DESCRIPTION

Figure 3:
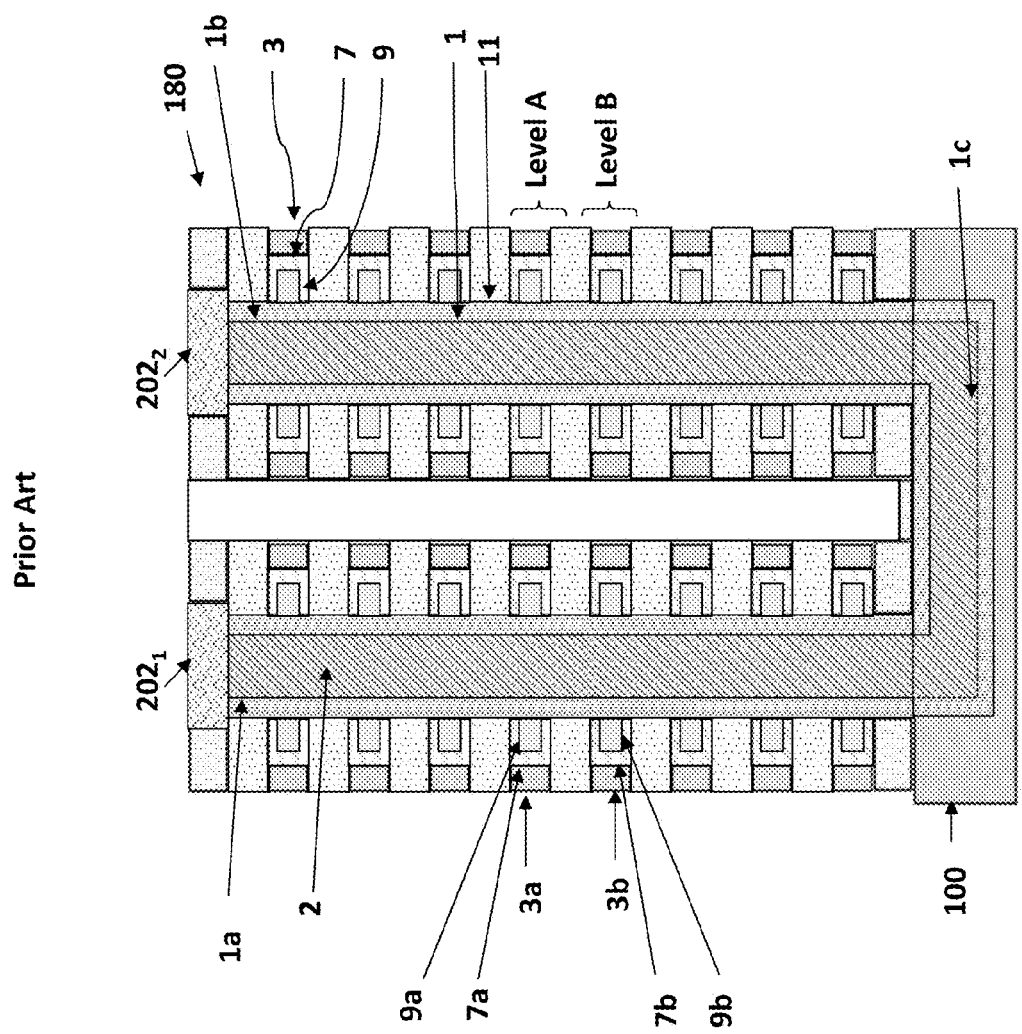
FIG. 3 is a side cross sectional view of a conventional NAND string of an embodiment with a U-shaped channel.

The present inventors have realized that monolithic three dimensional (e.g., vertical) NAND strings often have the blocking (e.g., inter-poly) dielectric 7 formed into a "clam shape" in horizontal recesses in memory openings in a stack of layers, as shown in FIGS. 1A, 2A and 3. The floating gates 9 are then formed in the openings in the claim shape in the blocking dielectric 7. Thus, the blocking dielectric 7 becomes part of the vertical stack of layers and effectively pinches off the floating gate 9 thickness (e.g., height). This leads to a reduced cell channel 1 length, such that the cell channel length is narrower (e.g., shorter) than the control gate 3 thickness (e.g., height) in the same cell. Specifically, the channel 1 length (and corresponding floating gate 9 thickness) in the vertical direction in FIGS. 1A, 2A and 3 is smaller than the control gate 3 thickness in the same direction by an amount which equals to two times the thickness of the blocking dielectric 7. The shorter channel length than control gate height leads to a reduced cell performance. Specifically, since the control gate of each cell is recessed away from the polysilicon body, the intensity of the fringe field from the control gate to the polysilicon body is reduced. Furthermore, the narrow cell channel length leaves an area of the polysilicon body which has little or no control gate control.

The present inventors have realized that a vertical NAND strings with floating gates and a longer cell channel length may have an improved performance by reducing or eliminating the above drawbacks. Preferably, the cell channel length is increased when the floating gate thickness is substantially the same as the thickness of the control gate (e.g., the thickness variation between control and floating gate is less than 5%, such as 0-3%). This configuration may be used for both channel injection and gate injection NAND strings. Specifically, in the gate injection type NAND strings, the resulting low coupling ratio is desirable.

A NAND string with the increased cell channel length and having a floating gate thickness which is substantially the same as the thickness of the control gate may have several different configurations.

Figure 4D:
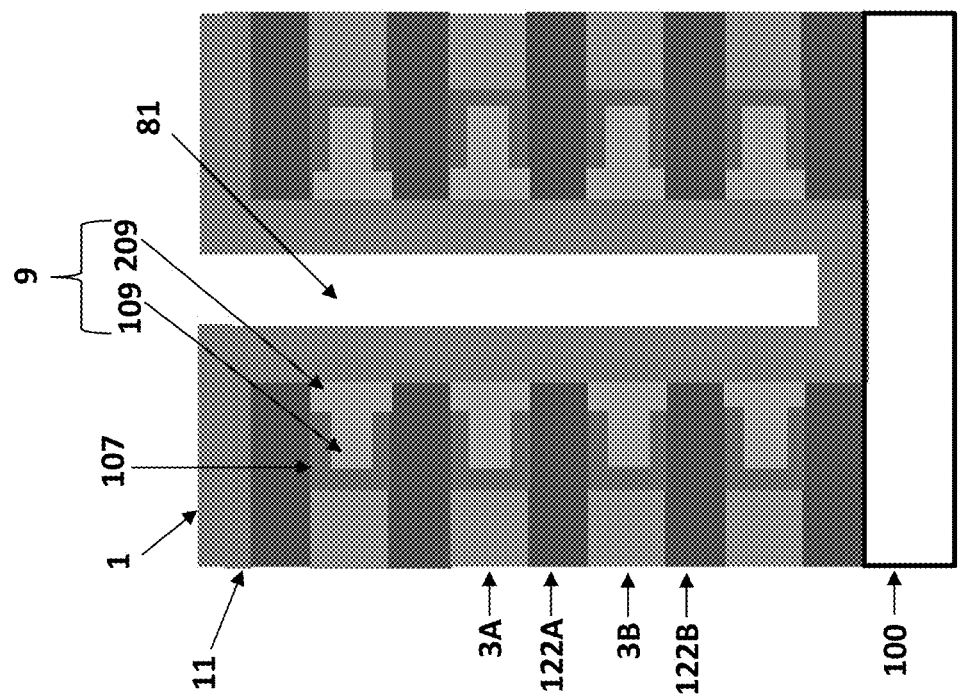
Figure 4C:
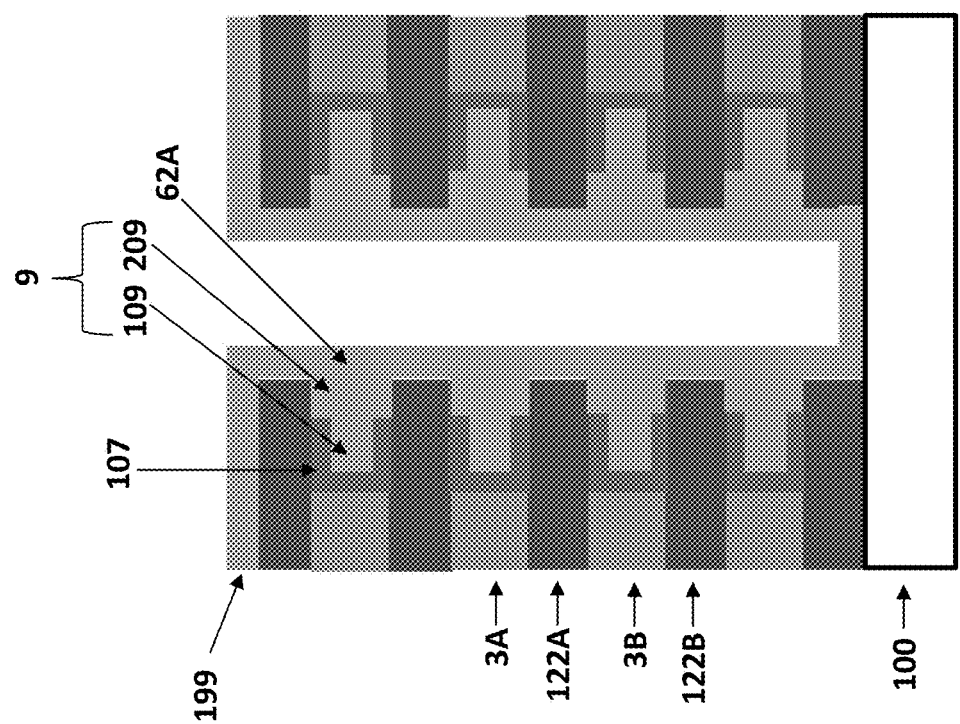
Figure 4E:
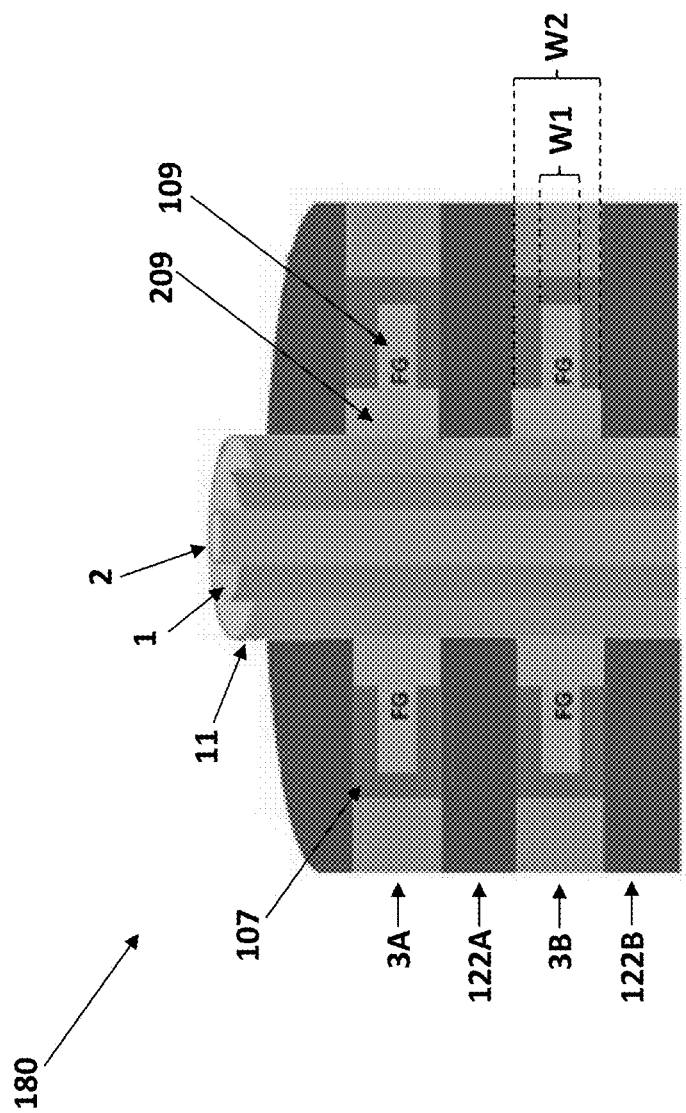
FIG. 4E is a hybrid perspective side cross sectional schematic illustration of a step of a method of making a NAND string according to an alternative embodiment.

In one embodiment configuration shown in FIG. 4E, each of the plurality of vertically spaced apart floating gates 9 have "sideways T" or "hammer" shape, such that each floating gate 9 has a first portion 109 having a first thickness in the vertical direction, and a second portion 209 located adjacent to the first portion 109 in the horizontal direction and having a different (e.g., greater) second thickness in the vertical direction than the first thickness. Preferably, the thinner first portion 109 is located closer to the control gate 3 of its cell (i.e., in the same device level) than the thicker second portion 209, while the second portion 209 is located closer to the channel 1 than the first portion 109.

In a channel injection type NAND device (i.e., where the charge carriers, such as electrons, are injected between the channel 1 and the floating gate 9), the first portion 109 is located adjacent to the blocking dielectric 7 and the second portion 209 is located adjacent to the tunnel dielectric 11. In gate injection type NAND device (i.e., where the charge carriers, such as electrons are injected between the control gate 3 and the floating gate 9), the positions of the tunnel and blocking dielectrics are reversed, and first portion 109 is located adjacent to the tunnel dielectric 11 and the second portion 209 is located adjacent to the blocking dielectric 7.

In another embodiment configuration shown in FIG. 5E, each of the interlayer insulating material layers 122 (e.g., silicon oxide layer) has the "sideways T" or "hammer" shape pointing in the opposite direction from that of the floating gates 9 of FIG. 4E. Each layer 122 has a first, thinner portion 222 having a first thickness in the vertical direction, and a thicker second portion 322 having a different (e.g., greater) second thickness in the vertical direction. Preferably, the thicker second portion 322 is located between control gate electrodes 3 in adjacent device levels while the first portion 222 is located between floating gates in adjacent device levels.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

In some embodiments, the monolithic three dimensional NAND string 180 comprises a semiconductor channel 1 having at least one end portion extending substantially perpendicular to a major surface 100a of a substrate 100, as shown in FIGS. 1A and 2A. "Substantially perpendicular to" (or "substantially parallel to") means within 0-10°. For example, the semiconductor channel 1 may have a pillar shape and the entire pillar-shaped semiconductor channel extends substantially perpendicularly to the major surface of the substrate 100, as shown in FIGS. 1A and 2A. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1A-3 for clarity.

In some embodiments, the semiconductor channel 1 may be a filled feature, as shown in FIGS. 2A, 2B and 3. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, as shown in FIGS. 1A-1B, 2A-2B and 3. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, tungsten nitride, copper, aluminum, tantalum, titanium, cobalt, titanium nitride or alloys thereof. For example, the control gate material in FIGS. 1A, 2A and 3 may comprise a conductive metal or metal alloy, such as tungsten and/or titanium nitride, or doped polysilicon.

A blocking dielectric 7 is located adjacent to the control gate electrode(s) 3 and may surround the control gate electrode 3, as shown in FIGS. 1A, 2A and 3A. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control gate electrodes 3a and 3b, respectively, as shown in FIG. 3. The blocking dielectric layer 7 may comprise a plurality of layers, such as a $SiO_2$ layer and a metal oxide layer, such as aluminum oxide.

The monolithic three dimensional NAND string also comprise a charge storage region 9. The charge storage region may comprise a plurality of discrete charge storage regions 9, as shown in FIGS. 1A, 2A and 3. The plurality of discrete charge storage regions 9 comprise at least a first discrete charge storage region 9a located in the device level A and a second discrete charge storage region 9b located in the device level B, as shown in FIG. 3A. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials. The blocking dielectric 7 and/or the tunnel dielectric 11 may include multiple layers of silicon oxide, silicon nitride and/or silicon oxynitride (e.g., ONO layers).

A method of making a NAND string 180 according to an embodiment is illustrated in FIGS. 4A-4E. In this embodiment, a stack 120 of alternating first material layers 121 and second material layers 122 different from the first material layer 121 are provided over a major surface 100a of a substrate 100, as illustrated in FIG. 4A. In an embodiment, the first material layers 121 comprise polysilicon or conductive control gate layers and the second material layers 122 comprise insulating layers, such as $SiO_2$ layers. In an alternative embodiment, layers 121 comprise sacrificial layers which are later replaced by metal or metal alloy control gate electrodes, as will be described in more detail below with respect to FIG. 4F. Similar to the NAND string 180 illustrated in FIGS. 1A-3 and discussed above, a NAND string made according to the method of the present embodiment may include a first material layer 121A and a second material layer 122A in a first device level and a first material layer 121B and a second material layer 122B in a second device level located below the first device level. The NAND string 180 may have any number of device levels, such as 2-32, such as 4-24, such as 8-16. A first select gate layer (e.g. a drain select gate layer, not shown for clarity) may be formed over the stack 120 and a second select gate layer (e.g. a source gate layer, not shown for clarity) may be formed below the stack 120. As illustrated in FIG. 4A, the method also includes forming a front side opening 81 (e.g. a memory hole) in the stack 120.

Next, as illustrated in FIG. 4B, the method includes selectively etching the first material layers 121 to form a plurality of front side recesses 62 between adjacent second material layers 122. The front side recesses 62 have second widths W2 (the first widths W1 are defined below) equal to the thicknesses of the first material layers 121.

A blocking dielectric 7 is conformally deposited in the plurality of front side recesses 62 through the front side opening 81. Portions of the blocking dielectric 7 in each of the plurality of front side recesses 62 have a clam shape 107 with a vertical portion 107c adjacent a remaining portion of the first material layer 121 and horizontal portions 107a, 107b adjacent the second material layers 122. The clam shaped portion 107 has an opening 107d that faces the front side openings 81. The opening 107d in the clam shaped portion 107 has a first width W1 (e.g. thickness) that is less than the second width W2 of the front side recess 62 by two times the thickness of the blocking dielectric 7 due to the formation of the blocking dielectric 7 in the front side recesses 62.

Next, as illustrated in FIG. 4B, the method includes a step of depositing a layer of floating gate material 99 in the front side openings 81 and in the openings 107d in the clam shaped portions 107 of the blocking dielectric 7.

Next, as illustrated in FIG. 4C, the method includes a step of partially removing (e.g. recessing) the layer of floating gate material 99 and the blocking dielectric 7 in the front portions 62A of the plurality of front side recesses 62 to form first portions 109 of a plurality of discrete charge storage regions 9, such as floating gates, located in the openings 107d of the clam shaped portion 107 of the blocking dielectric 7 in the front side recesses 62. The first portions 109 of the plurality of discrete charge storage regions 9 have a thickness equal to the first width W1 of the clam shaped portions 107 of the blocking dielectric 7.

In one embodiment, partially removing the floating gate material 99 and the blocking dielectric 7 in the plurality of front side recesses 62 comprises sequentially selectively etching the floating gate material 99 followed by selectively etching the blocking dielectric 7. In another embodiment, partially removing the floating gate material 99 and the blocking dielectric 7 in the plurality of front side recesses 62 comprises selectively etching the floating gate material 99 and the blocking dielectric 7 during a same etching step.

Next, a second layer of floating gate material 199 is deposited in the front side recesses 62 to form second portions 209 of the plurality of discrete charge storage regions 9 (e.g. floating gates) in the front side recesses 62. The second portions 209 of the plurality of discrete charge storage regions (e.g. floating gates) 9 have a thickness equal the second width W2 of the front side recesses 62 because the blocking dielectric 7 is removed from the front portions 62A of the front side recesses. Excess floating gate material 199 may then be removed from the front side openings 81 to electrically separate the discrete charge storage regions (e.g. floating gates) 9 from each other.

Alternatively, the second portions 209 of the plurality of floating gates 9 in the front side recesses 62 are formed by selectively epitaxially growing single crystal silicon regions on polysilicon seed first portions 109 of the floating gates 9 in the memory opening 81 such that the single crystal silicon regions fill a remaining space in the plurality of front side recesses 62 and protrude into the memory opening 81 beyond the plurality of front side recesses 62. Next, the tunnel dielectric 11 may be formed by oxidizing a portion of the single crystal silicon regions which protrude into the memory opening 81 beyond the plurality of front side recesses 62.

Next as illustrated in FIG. 4D, the method includes steps of forming a tunnel dielectric 11 over the floating gate 9 in the front side openings 81 and forming a semiconductor channel 1 over the tunnel dielectric 11 in the front side openings 81. In the embodiment illustrated in FIG. 4E, the method includes providing an insulating fill material 2 inside the semiconductor channel 1. As in the embodiment illustrated in FIG. 4D, the discrete charge storage regions 9 include first portions 109 with a thickness equal to the first width W1 of the openings 107d and second portions 209 with a thickness equal to the second width W2 of the front side recesses 62. Thus, the second portions 209 of the charge storage regions 9 have a width (e.g., thickness) which is substantially equal to that of the control gates 3.

In an alternative embodiment, the tunnel dielectric 11 is formed by oxidation of an underlying silicon layer. In this embodiment, forming the second portions 209 of the plurality of charge storage regions 9 (e.g., floating gates) in the front side recesses 62 comprises depositing a silicon layer 199 (or single epitaxial silicon regions 209) in the front side openings 81 such that the silicon layer 199 or region fill a remaining space in the plurality of front side recesses 62 and protrude into the front side openings 81 beyond the plurality of front side recesses 62. In this embodiment, forming the tunnel dielectric 11 comprises oxidizing a portion of the silicon layer 199 or single crystal silicon regions 209 which protrude into the front side openings 81 beyond the plurality of front side recesses 62. Oxidation of single crystal portions 209 forms a quality tunnel dielectric 11.

In another embodiment, forming the second portions 209 of the plurality of charge storage regions 9 in the front side recesses 62 comprises depositing a silicon layer in the front side openings such that the silicon layer fills a remaining space the plurality of front side recesses 62 and removing a portion of the silicon layer which protrudes into the front side opening 81 beyond the plurality of front side recesses 62. In this embodiment, forming the tunnel dielectric 11 comprises depositing the tunnel dielectric 11 into the front side opening 81 over the second portions 209 of the plurality of charge storage regions 9.

In the above embodiment, the first material layers 121 comprise control gate electrode 3 layers and the second material layers 122 comprise insulating material layers.

However, as noted above, in an alternative embodiment, the first material layers 121 comprise sacrificial material layers (e.g. silicon nitride or polysilicon) and the second material layers 122 comprise insulating material layers.

A step in the alternative embodiment method is illustrated in FIG. 4F. In this embodiment, the method further comprises forming a back side opening 84 (e.g. a slit trench) through the plurality of alternating sacrificial first material layers 121 and the insulating second material layers 122. The method also includes removing the sacrificial first material layers 121 through the back side opening 84 to form a plurality of control gate recesses. Next, conductive control gate electrodes 3 (e.g. metal electrode, such as tungsten and/or titanium nitride electrodes) are formed in the plurality of control gate recesses through the back side opening 84, as described in U.S. patent application Ser. No. 14/183,152, filed Feb. 18, 2014, hereby incorporated by reference in its entirety.

In the embodiment of FIG. 4E, each of the first portions 109 of the plurality of charge storage regions 9 has a first thickness equal to the first width W1 in a vertical direction substantially perpendicular to the major surface 100a of the substrate 100. Each of the second portions 209 of the plurality of charge storage regions 9 has second thickness equal to the second width W2 in the vertical direction, which is larger than the first thickness. Each of the second material layers 122 in this embodiment preferably has a uniform thickness. Each of the plurality of control gate electrodes 3 has a thickness which is substantially the same as the second thickness and which is larger than the first thickness. The capacitance between each control gate electrode 3 and each charge storage region (floating gate) 9 is less than a capacitance between each charge storage region (floating gate) 9 and the semiconductor channel 1. The tunnel dielectric 11 preferably has a straight sidewall. Each of the first portions 109 of the plurality of charge storage regions 9 is located in the opening 107d in the clam shaped portion 107 of the blocking dielectric 7. Each of the second portions 209 of the plurality of charge storage regions 9 is located outside of the opening 107d in the clam shaped portion 107 of the blocking dielectric 7.

Preferably, the second material layers 122 comprise silicon oxide and at least the second portions 209 of the plurality of charge storage regions 9 comprise polysilicon. The first portions 109 may also comprise polysilicon. In another embodiment, the first portions 109 of the plurality of charge storage regions (floating gates) 9 comprise a metal, a metal silicide or a metal nitride, as will be described in more detail below with regard to FIGS. 6A-6F.

Figure 5D:
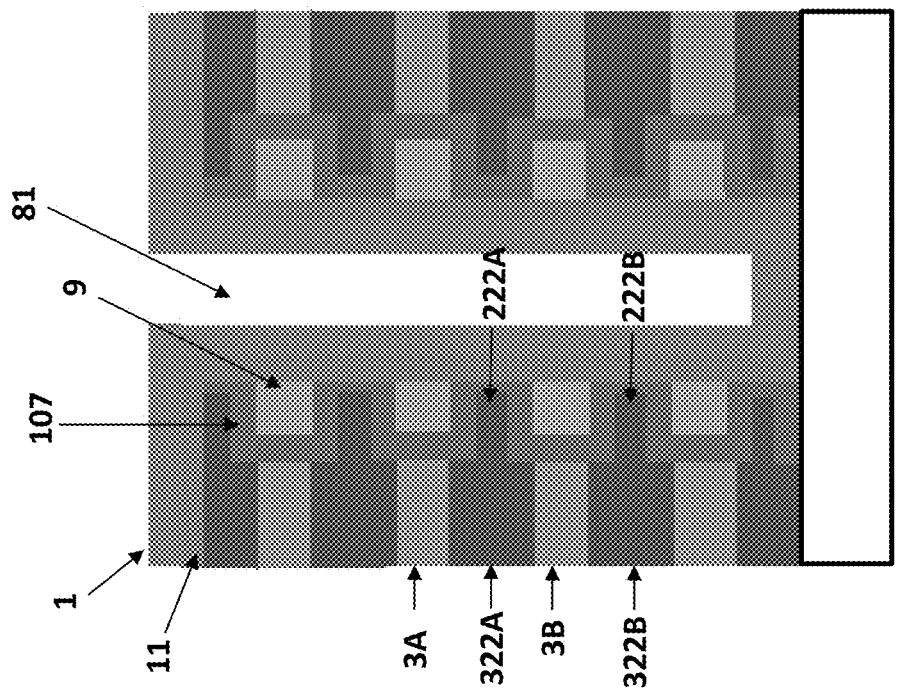

FIGS. 5A-5E illustrate another embodiment of a method of making a monolithic three dimensional NAND string 180 in which the floating gate thickness is substantially the same as the thickness of the control gate. The method includes providing a stack 120 of alternating first material layers 121 and second material layers 122 different from the first material layers 121 over a substrate 100 as shown in FIG. 1A. The method also includes etching at least one front side (memory) opening 81 in the stack 120 and selectively etching the first material layers 121 to form a plurality of front side recesses 62 between adjacent second material layers 122, as shown in FIG. 5B. In an embodiment, the first material layers 121 comprise control gate electrode layers and the second material layers 122 comprise insulating material layers. The second material layers 122 may comprise silicon oxide. In an alternative embodiment, the first material layers 121 comprise sacrificial material layers and the second material layers 122 comprise insulating material layers.

Next, the second material layers 122 are selectively etched to widen the width of the plurality of front side recesses 62 to width W2 as illustrated in FIG. 5B. As a result of this etching step, the second material layers 122 have a thinner front portions 222A, 222B facing the channel and thicker (unetched) rear portions 322A, 322B facing the control gates. In other words, the thickness (i.e., height in the vertical direction) of the front portion of the interlayer insulating material layers 122 exposed in the recesses 62 is reduced during the etching step. A blocking dielectric 7 is then conformally deposited in the plurality of front side recesses 62 through the front side opening 81. Portions of the blocking dielectric 7 in each of the plurality of front side recesses 62 have a clam shape 107 having a vertical portion 107c adjacent a remaining portion of the first material layer 121 and horizontal portions 107a, 107b adjacent to the second material layers 122 and an opening 107d having a first thickness W1 in the front side recess 62. Thus, the thickness of the blocking dielectric 7 is equal to W2-W1 and the thickness of the control gate electrodes 3 is about W1. Thus, the front side recesses 62 are widened by a width of about W2-W1.

Figure 5C:
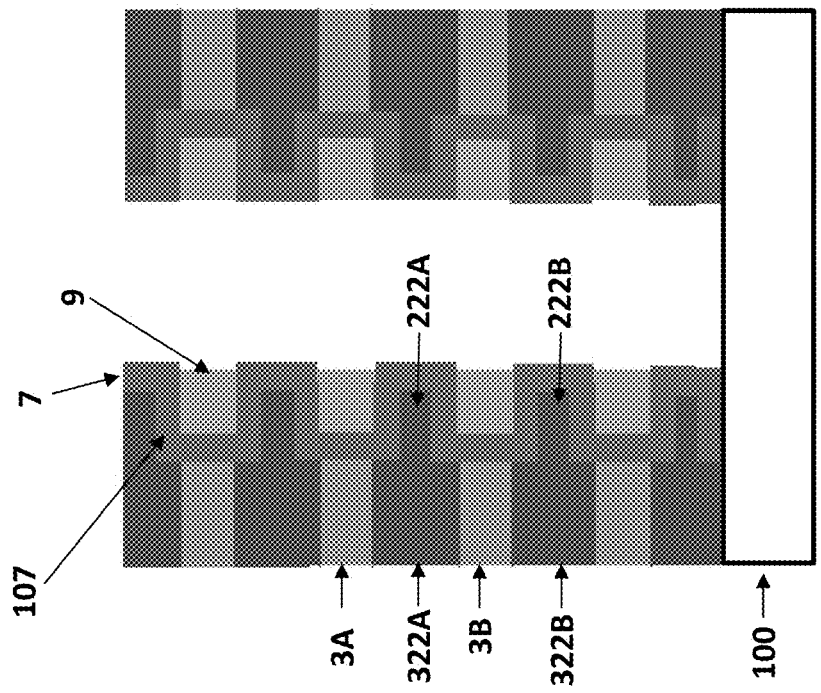

Next, as illustrated in FIG. 5C, the method includes forming a plurality of floating gates 9 located in the front side opening 81 in the clam shaped portions 107 of the blocking dielectric 7. The plurality of floating gates 9 comprise polysilicon, metal or a metal alloy. As illustrated in FIG. 5D, the method also includes forming a tunnel dielectric 11 in the front side opening 81 and forming a semiconductor channel 1 over the tunnel dielectric 11 in the front side opening 81. In the embodiment illustrated in FIG. 5E, the method includes providing an insulating fill material 2 inside the semiconductor channel 1.

In an embodiment, the opening 107d in the clam shaped portions 107 of the blocking dielectric 7 has substantially the same thickness W1 as a thickness of the first material layers 121 and each of the plurality of floating gates 9 has substantially the same thickness as the thickness of the first material layers 121.

In an embodiment, the method further comprises etching the blocking dielectric 7 from a bottom of the front side opening 81 prior to depositing the tunnel dielectric 11.

In another aspect of this embodiment, the control gate electrodes 3 are formed by the replacement method. The method further comprises forming a back side opening 84 (shown in FIG. 4F) through the stack 120 plurality of alternating sacrificial material layers 121 and the insulating material layers 122, removing the sacrificial material layers through the back side opening 84 to form a plurality of backside (control gate) recesses and forming conductive (e.g. metal or metal ally) control gate electrodes 3 in the plurality of backside (control gate) recesses through the back side opening 84.

Figure 6D:
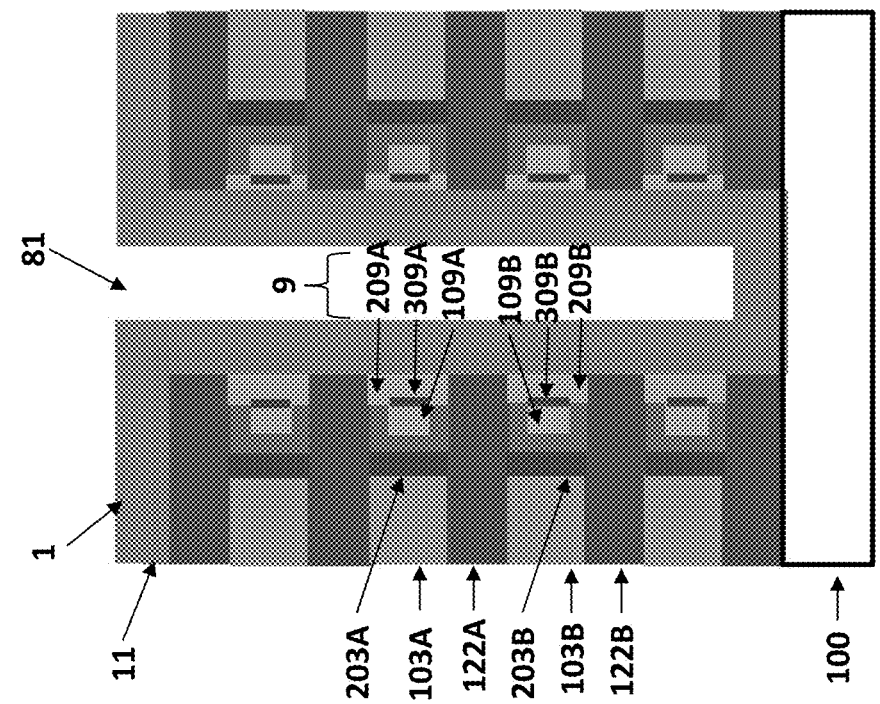

FIGS. 6A-6F illustrate methods of making a NAND string 180 having metal and polysilicon containing floating gates and/or control gates according to alternative embodiments. As illustrated in FIG. 6A, the method includes providing a stack 120 of alternating first material layers 121 and second material layers 122 different from the first material layers 121 over a substrate 100 and etching at least one front side (memory) opening 81 in the stack 120. Next, as illustrated in FIG. 6B, the first material layers 121 are selectively etched to form a plurality of front side recesses 62 between adjacent second material layers 122.

In this embodiment, the first material layers 121 comprise a control gate electrode 3 material such as polysilicon. After forming the front side recesses 62, the remaining portions of the first material layers 121 between the second material layers 122 form first portions 103A, 103B of control gate electrodes 3 in each device level. As illustrated in FIG. 6B, the method further comprises forming a first electrically conductive layer forming second control gate portions 203A, 203B on exposed sidewalls of the first material layers 121 in the plurality of front side recesses 62 between adjacent second material layers 122 prior to conformally depositing a blocking dielectric 7 in the plurality of front side recesses 62.

After forming the first electrically conductive layer portions 203A, 203B, a blocking dielectric 7 is conformally deposited in the plurality of front side recesses 62 through the front side opening 81. Portions of the blocking dielectric 7 in each of the plurality of front side recesses 62 have a clam shape 107 with a vertical portion 107c adjacent to the control gates 103/203 and horizontal portions 107a, 107b adjacent the second material layers 122. The clam shaped portion 107 has an opening 107d that faces the front side openings 81. The opening 107d in the clam shaped portion 107 has a first width W1 that is less than the second width W2 of the front side recess 62 due to the formation of the blocking dielectric 7 in the front side recesses 62.

Figure 6C:
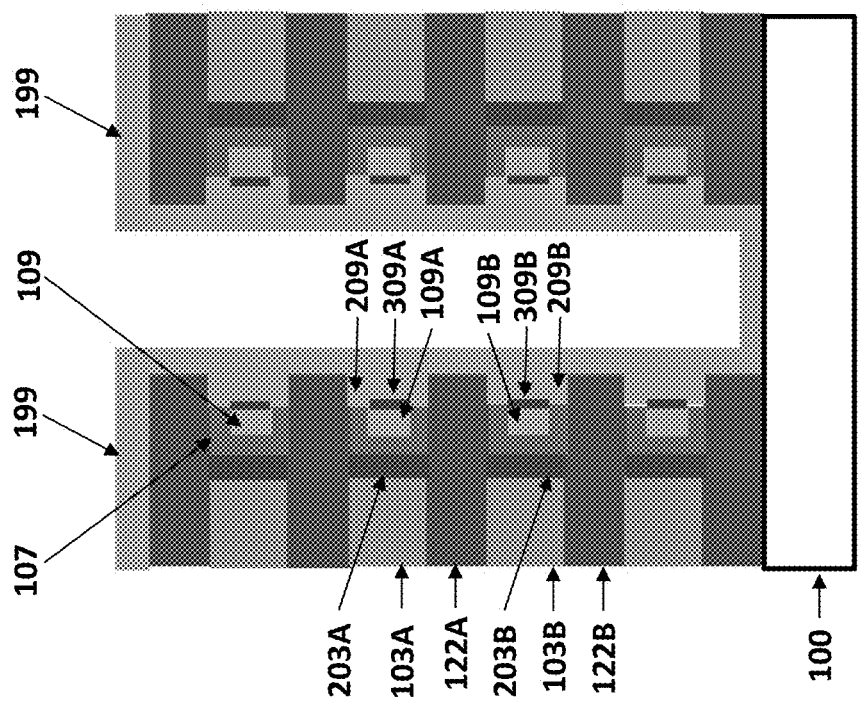

Next, similar to the method described in FIGS. 4A-4D above, the method includes a step of depositing a layer of floating gate material 99 in the front side openings 81 and in the openings 107d in the clam shaped portions 107 of the blocking dielectric 7. Then, as illustrated in FIG. 6C, the method includes a step of partially removing the layer of floating gate material 99 and the blocking dielectric 7 in the plurality of front side recesses 62 to form first portions 109A, 109B of a plurality of discrete charge storage regions 9, such as floating gates, located in the openings 107d of the clam shaped portion 107 of the blocking dielectric 7 in the front side recesses 62. The first portions 109A, 109B of the plurality of discrete charge storage regions 9 have a thickness equal to the first width W1 of the clam shaped portions 107 of the blocking dielectric 7.

Next as illustrated in FIG. 6C, the method according to this embodiment, in contrast to the embodiment illustrated in FIGS. 4A-4D, includes a step of depositing a second electrically conductive layer having portions 309A, 309B on exposed sidewalls of the remaining first portions 109A, 109B of the floating gate material 99 in openings 107d of the plurality of front side recesses 62 between adjacent second material layers 122. This step is performed after the step of partially removing the floating gate material 99 and the blocking dielectric 7 and prior to the step of forming second portions 209A, 209B of the plurality of floating gates 9 in the front side recesses 62 discussed in more detail below.

A second layer of floating gate material 199 is then deposited in the front side recesses 62 to form second portions 209A, 209B of the plurality of discrete charge storage regions 9 (e.g. floating gates) in the front side recesses 62, as shown in FIG. 6C. The second portions 209A, 209B of the plurality of discrete charge storage regions 9 have a thickness equal the second width W2 of the front side recesses 62. Excess floating gate material 199 may then be removed from the front side openings 81 to electrically separate the discrete charge storage regions 9 from each other as illustrated in FIG. 6D.

Next as illustrated in FIG. 6D, the method includes steps of forming a tunnel dielectric 11 in the front side openings 81 and forming a semiconductor channel 1 over the tunnel dielectric 11 in the front side openings 81. In the embodiment illustrated in FIG. 6E, the method includes providing an insulating fill material 2 inside the semiconductor channel 1. As in the embodiment illustrated in FIG. 6D, the discrete charge storage regions 9 include first portions 109 with a thickness equal to the first width W1 of the openings 107d and second portions 209 with a thickness equal to the second width W2 of the front side recesses 62 and of the control gate electrodes 3.

Figure 6F:
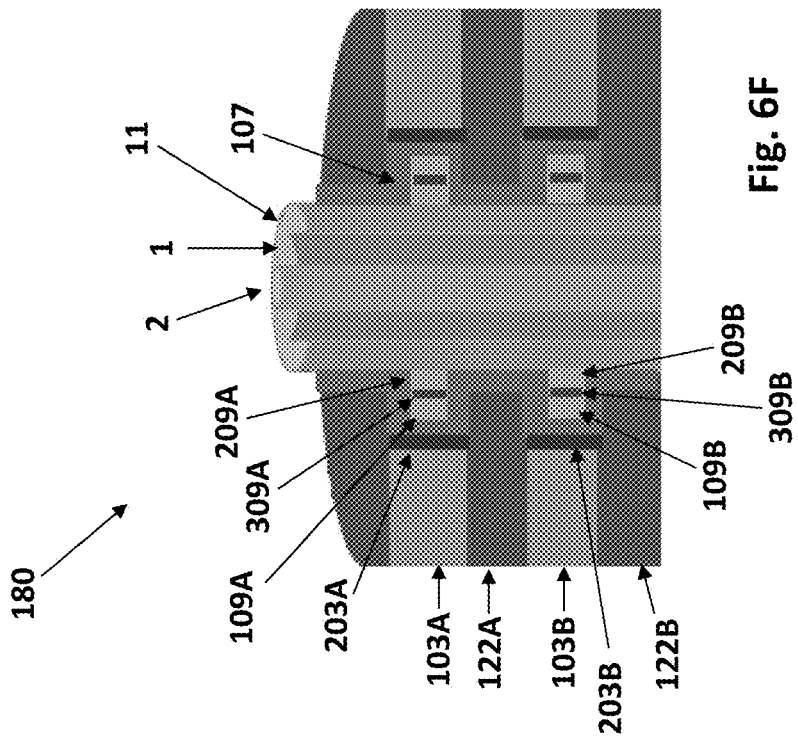
FIG. 6F is a hybrid perspective side cross sectional schematic illustration of a NAND string according to an alternative embodiment.
Figure 6E:
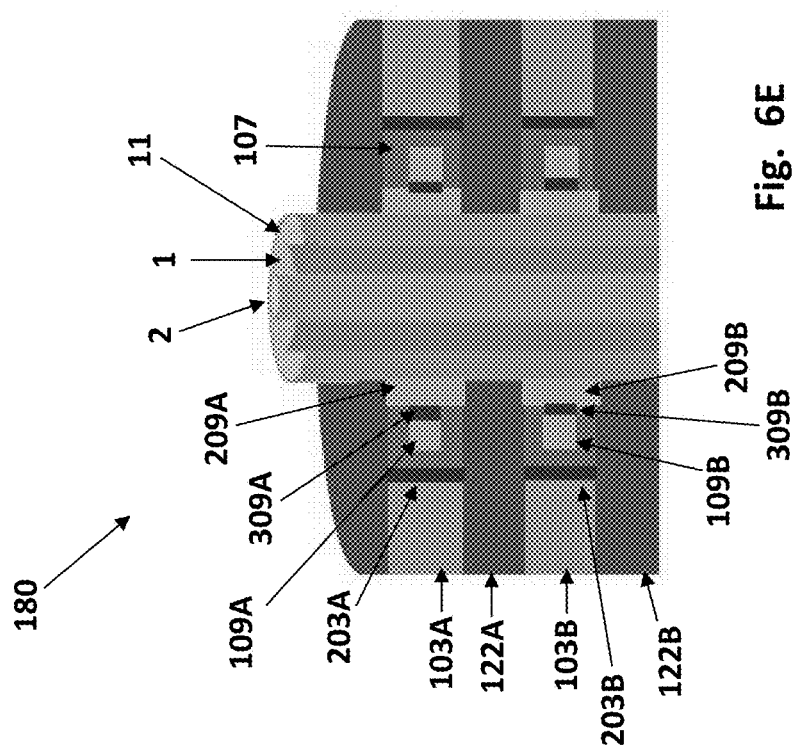

In the embodiment illustrated in FIG. 6E, the method includes providing an insulating fill material 2 inside the semiconductor channel 1. As in the prior embodiment illustrated in FIG. 4E, the discrete charge storage regions 9 include first portions 109A, 109B with a thickness equal to the first width W1 of the openings 107d and second portions 209A, 209B with a thickness equal to the second width W2 of the front side recesses 62 and the control gates electrodes 3 and third portions comprising a second electrically conductive layer 309A, 309B. In this embodiment, the control gate electrodes 3 comprise first control gate portions 103A, 103 comprising the portions of the first material layers 121 and second portions 203A, 203B of the first electrically conductive layer.

In an embodiment, the first 203 and the second 309 electrically conductive layers comprise a metal (e.g., Ti or W), a metal silicide (e.g. titanium silicide or tungsten silicide), a conductive metal oxide or a conductive metal nitride (e.g., TiN). In an embodiment, the first 203 and second 309 electrically conductive layers comprise W, Ti or TiN deposited by atomic layer deposition. Thus, the third portions 309A, 309B of the charge storage regions 9 and the second portions 203A, 203B of the control gates 3 comprise metal, metal silicide, conductive metal oxide or conductive metal nitride. In an embodiment, the first material layers 121 comprise polysilicon which forms first portions 103A, 103B of a plurality of control gate electrodes 3 and layers 99 and 199 comprise polysilicon. Patterned layers 99 and 199 form polysilicon portions 109A, 109B and 209A, 209B of the charge storage regions 9.

In an embodiment, the method further comprises at least one of (1) reacting the first electrically conductive layer 203, which comprises Ti or W, with the first material layers 121 comprising polysilicon to form a titanium or tungsten silicide portions 203A, 203B of the plurality of control gate electrodes 3 and/or (2) reacting the second electrically conductive layer 309, which comprises Ti or W, with the plurality of floating gates portions 109 comprising polysilicon to form a titanium or tungsten silicide portions 109A, 109B of the plurality of floating gates.

In another embodiment the method further comprises forming control gate electrodes 3 by a replacement method. In this embodiment, layers 121 may comprise sacrificial polysilicon layers or sacrificial silicon nitride layers. The method includes forming a back side opening 84 through a plurality of alternating sacrificial material layers 121 and insulating material layers 122. The method also includes removing the sacrificial material layers through the back side opening 84 to form a plurality of control gate recesses. The method also includes forming conductive (e.g., metal, metal alloy, metal silicide, metal nitride) control gate electrode portions 103A in the plurality of control gate recesses through the back side opening 84.

FIG. 6F illustrates another NAND string 180 according to an embodiment. This embodiment is similar to the embodiment illustrated in FIG. 6E. However, in this embodiment, the charge storage regions (e.g. floating gates) 9 include three portions 109A, 209A, 309A, and 109B, 209B, 309B that have the same first width W1 as each other. That is, in this embodiment, the clam shaped portions 107 of the blocking dielectric 7 in the front side recesses 62 are not recessed. In an embodiment, the first and second portions 109A, 209A and 109B, 209B comprise polysilicon and the third portions 309A and 309B) comprises metal, a metal silicide, a conductive metal oxide or a conductive metal nitride. The control gate electrodes 3, similar to the control gates electrodes 3 in the previous embodiment, comprise two portions, 103A, 203A, 103B, 203B of different materials. Preferably, a first portion 103A (103B) comprises polysilicon and a second portion 203A (203B) comprises a metal, a metal silicide, a conductive metal oxide or a conductive metal nitride.

In an embodiment, the NAND string 180 illustrated in FIG. 6F may be fabricated by providing a stack 120 of alternating first material layers 121 and second material layers 122 different from the first material layer 121 over a major surface 100a of a substrate 100, etching at least one front side opening (memory opening) 81 in the stack 120, selectively etching the first material layers 121 to form a plurality of front side recesses 62 between adjacent second material layers 122 and conformally depositing a blocking dielectric 7 in the plurality of front side recesses 81 through the front side opening (memory opening) 81. Portions of the blocking dielectric 7 in each of the plurality of front side recesses 62 have a clam shape 107 having a vertical portion 107c adjacent a remaining portion of the first material layer 121 and horizontal portions 107a, 107b adjacent the second material layers 122 and an opening 107d having a first thickness W1 in the front side recess 62. The method also includes forming a floating gate 9 material in the front side openings 81 in the clam shaped portions 107 of the blocking dielectric 7, partially removing the floating gate 9 material in the plurality of front side recesses 62 to form first portions 109a of a plurality of floating gates 9 located in the opening 107d in the clam shaped portions 107 of the blocking dielectric 7. The method also includes forming third portions 309A of the plurality of floating gates 9 located in the opening 107d in the clam shaped portions 107 of the blocking dielectric 7 after forming the first portions 109a of the plurality of floating gates 9, and forming second portions 209A of the plurality of floating gates 9 located in the opening 107d in the clam shaped portions 107 of the blocking dielectric 7 after forming the third portions 309A of the plurality of floating gates 9. The method also includes forming a tunnel dielectric 11 in the front side opening (e.g., memory opening) 81 and forming a semiconductor channel 1 over the tunnel dielectric 11 in the front side opening 81.

The method of this embodiment may further include the steps of forming a back side opening 84 through the plurality of alternating first material layers 121 and second material layers 122, removing the first material layers 121 through the back side opening 84 to form a plurality of control gate recesses and forming conductive control gate electrodes 3 in the plurality of control gate recesses through the back side opening 84. In an aspect of this embodiment, the step of forming conductive control gate electrodes 3 in the plurality of control gate recesses through the back side opening 84 comprises forming a first conductive portion 103A of the control gate electrode 3 followed by forming a second portion 203A of the control gate electrode 3. The first and second portions 103A, 203A of the control gate electrode 3 comprise different conductive materials. Alternatively, the second portions 203A of the control gate electrodes 3 may be formed in the front side opening 81.

Figure 7:
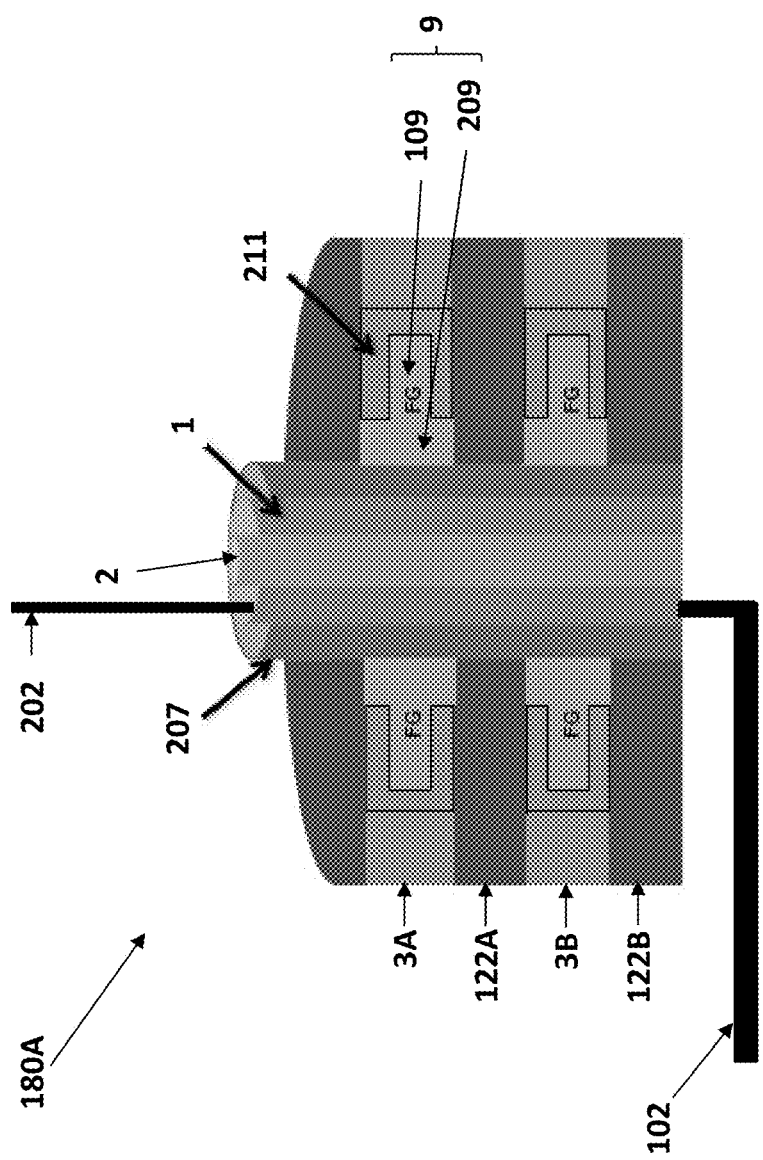
FIG. 7 is a hybrid perspective side cross sectional schematic illustration of a NAND string according to an alternative embodiment.

FIG. 7 illustrates an embodiment of a NAND string 180 that is configured for gate injection. In the previous embodiments, the NAND strings 180 were configured for channel injection (i.e., where the charge carriers, such as electrons, are injected between the channel 1 and the floating gate 9). In the previous embodiments, the first portion 109 of the floating gate 9 is located adjacent to the blocking dielectric 207 and the second portion 209 of the floating gate is located adjacent to the tunnel dielectric 11. As illustrated in FIG. 7, in the gate injection type NAND device according to this embodiment (i.e., where the charge carriers, such as electrons, are injected between the control gate 3 and the floating gate 9), the positions of the tunnel 211 and blocking 207 dielectrics are reversed. The first portion 109 of the floating gate 9 is located adjacent to the tunnel dielectric 211 and the second portion 209 of the floating gate 9 is located adjacent to the blocking dielectric 207.

Another embodiment includes a method of operating the monolithic three dimensional NAND string 180 illustrated in FIG. 7. The NAND string 180 has a semiconductor channel 1 with at least one portion extending substantially perpendicular to a major surface 100a of a substrate 100, a source electrode 102 and a drain electrode 202 contacting opposite ends of the semiconductor channel 1, a blocking dielectric 207 located between the channel 1 and the charge storage region 9, and a control gate electrode 3 separated from a charge storage region 9 by a tunnel dielectric 211. The method comprises applying a first voltage difference between the source electrode 102 or the drain electrode 202 and the control gate electrode 3 to cause a charge to flow from the control gate electrode 3 through the tunnel dielectric 211 into the charge storage region 9.

In an embodiment, the method further comprises applying a second voltage difference between the source electrode 102 or the drain electrode 202 and the control gate electrode 3 to cause the charge to flow from the charge storage region 9 through the tunnel dielectric 211 into the control gate electrode 3. In an embodiment, the charge storage region 9 comprises a floating gate having a first portion 109 located adjacent to the tunnel dielectric 211. The first portion 109 of the floating gate 9 has a first thickness W1. The floating gate 9 has a second portion 209 located adjacent to a blocking dielectric 207. The second portion 209 has a second thickness W2 which is larger than the first thickness W1. A capacitance between the control gate electrode 3 and the floating gate 9 is less than a capacitance between the floating gate 9 and the semiconductor channel 1. For example, for devices which have 30 nm control gates 3 and 10 nm blocking dielectrics 7, using gate injection having the gate configuration illustrated in FIG. 7 results in a lowering of capacitance between the floating gates 9 and the control gates by a factor of 3. Further, the capacitance between the channel 1 and the floating gates 9 is increased by a factor of three.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A monolithic three dimensional NAND string, comprising:
    a stack of alternating first material layers and second material layers different from the first material layers over a major surface of a substrate, wherein:
        the first material layers comprise a plurality of control gate electrodes and the second material layers comprise an insulating material; and
        the plurality of control gate electrodes extend in a first direction substantially parallel to the major surface of the substrate and comprise at least a first control gate electrode located in a first device level and a second control gate electrode located in a second device level located above the first device level;
    a semiconductor channel comprising at least one portion extending through the stack in a second direction substantially perpendicular to the major surface of the substrate;
    a plurality of vertically spaced apart clam shaped blocking dielectrics, wherein each of the clam shaped blocking dielectrics is in contact with a respective control gate electrode among the plurality of control gate electrodes and is a conformal structure having a uniform thickness throughout;
    a plurality of vertically spaced apart floating gates, wherein the plurality of vertically spaced apart floating gates comprise at least a first spaced apart floating gate located in the first device level and a second spaced apart floating gate located in the second device level; and
    a tunnel dielectric located between each one of the plurality of the vertically spaced apart floating gates and the semiconductor channel;
        wherein each of the plurality of vertically spaced apart floating gates comprises a first portion that has a first thickness in the second direction and is vertically spaced from a bottom surface of a respective overlying second material layer and from a top surface of a respective underlying second material layer by horizontal portions of a respective clam shaped blocking dielectric having the uniform thickness and is laterally spaced from the respective control gate electrode by a vertical portion of the respective clam shaped blocking dielectric having the uniform thickness and contacting the respective control gate electrode, and a second portion adjacent to the first portion in the first direction and having a second thickness in the second direction which is different than the first thickness and in physical contact with the bottom surface of the respective overlying second material layer and with the top surface of the respective underlying second material layer.

2. The NAND string of claim 1, wherein the first portion is located closer to a control gate electrode located at the same device level than the second portion, while the second portion is located closer to the semiconductor channel than the first portion.

3. The NAND string of claim 2, wherein:
each of the second material layers has a uniform thickness in the second direction; and
each of the plurality of control gate electrodes has a thickness in the second direction which is substantially the same as the second thickness of the second portion of each of the plurality of spaced apart floating gates and which is larger than the first thickness of the first portion of each of the plurality of spaced apart floating gates.

4. The NAND string of claim 3, wherein:
the tunnel dielectric has a straight sidewall;
each first portion of the plurality of spaced apart floating gates is located in an opening in a respective clam shaped blocking dielectric;
each second portion of the plurality of spaced apart floating gates is located outside of the opening in the respective clam shaped blocking dielectric;
a capacitance between each control gate electrode and each floating gate is less than a capacitance between each floating gate and the semiconductor channel;
the second material layers comprise silicon oxide; and
at least the second portion of the plurality of spaced apart floating gates comprises polysilicon.

5. The NAND string of claim 4, wherein the first portion of the plurality of spaced apart floating gates comprises a metal, a metal silicide or a metal nitride.

6. The NAND string of claim 1, further comprising:
a first select gate located adjacent to an upper end of the semiconductor channel;
a second select gate located adjacent to a lower end of the semiconductor channel;
a first electrode which contacts the upper end of the semiconductor channel; and
a second electrode which contacts the lower end of the semiconductor channel.

7. The NAND string of claim 1, wherein:
the semiconductor channel has a "U" shape with a horizontal portion substantially parallel to the major surface of the substrate and first and second wing portions substantially perpendicular to the major surface of the substrate;
a first select gate is located adjacent to the first wing portion;
a second select gate is located adjacent to the second wing portion;
a first electrode contacts the first wing portion; and
a second electrode contacts the second wing portion.

8. The NAND string of claim 1, wherein:
each of the plurality of control gate electrodes comprises a first portion comprising polysilicon and a second portion comprising a metal, a metal silicide, a conductive metal oxide or a conductive metal nitride; and
each of the plurality of spaced apart floating gates comprises a third portion located between the first and second portions, the first and second portions comprise polysilicon and the third portion comprises metal, a metal silicide, a conductive metal oxide or a conductive metal nitride.

9. The NAND string of claim 8, wherein the second portion of the control gate electrodes comprises W or Ti and the third portion the plurality of spaced apart floating gates comprises W or Ti.

10. The NAND string of claim 1, wherein:
the substrate comprises a silicon substrate;
the device comprises a monolithic, three dimensional array of NAND strings located over the silicon substrate;
at least one memory cell in the first device level of the three dimensional array of NAND strings is located over another memory cell in the second device level of the three dimensional array of NAND strings; and
the silicon substrate contains an integrated circuit comprising a driver circuit for the memory device located thereon.

11. A method of operating a monolithic three dimensional NAND string, comprising:
providing the monolithic three dimensional NAND string of claim 1; and
applying a first voltage difference between a source electrode or a drain electrode and one control gate electrode of the plurality of control gate electrodes to cause a charge to flow from the control gate electrode through one clam shaped blocking dielectric among the clam shaped blocking dielectrics into one floating gate of the plurality of vertically spaced apart floating gates.

12. The method of claim 11, further comprising applying a second voltage difference between the source electrode or the drain electrode and the control gate electrode to cause the charge to flow from the charge storage region through the one clam shaped blocking dielectric into the control gate electrode.

13. The method of claim 12, wherein:
a capacitance between the control gate electrode and the floating gate is less than a capacitance between the floating gate and the semiconductor channel.

14. The NAND string of claim 1, wherein each of the plurality of vertically spaced apart floating gates further comprises a third portion located between the first and second portions and wherein the first and second portions comprise polysilicon and the third portion comprises metal, a metal silicide, a conductive metal oxide or a conductive metal nitride.

15. The NAND string of claim 14, wherein:
each of the plurality of control gate electrodes comprises a first portion comprising polysilicon and a second portion comprising a metal, a metal silicide, a conductive metal oxide or a conductive metal nitride.

16. The NAND string of claim 1, wherein, for each second portion, a bottom surface of a respective overlying second material layer in contact with the second portion is within a first horizontal plane that includes an interface between the respective overlying second material layer and a first material layer located at a same level as the second portion.

17. The NAND string of claim 16, wherein, for each second portion, a top surface of a respective underlying second material layer in contact with the second portion is within a second horizontal plane that includes an interface between the respective underlying second material layer and the first material layer located at the same level as the second portion.

18. The NAND string of claim 1, wherein each portion of the claim shaped blocking dielectric is laterally spaced from the tunneling dielectric by a respective second portion of the floating gates.

19. The NAND string of claim 1, wherein each second portion has a same thickness as a respective control gate electrode located at a same level.

20. The monolithic three dimensional NAND string of claim 1, wherein an entirety of surface portions of the clam shaped blocking dielectrics that contact any of the second material layers has a same composition as an entirety of surface portions of the clam shaped blocking dielectrics that contact any of the control gate electrodes.

* * * * *